United States Patent [19]

Stakely et al.

[11] Patent Number: 5,122,680
[45] Date of Patent: Jun. 16, 1992

[54] PRECISION HYSTERESIS CIRCUIT

[75] Inventors: Barry L. Stakely, Durham; Ronald L. Wenda, Raleigh, both of N.C.

[73] Assignee: International Business Machines Corporation, Armonk, N.Y.

[21] Appl. No.: 604,320

[22] Filed: Oct. 29, 1990

[51] Int. Cl.[5] ............................................ H03K 5/153
[52] U.S. Cl. .................................... 307/354; 307/362
[58] Field of Search ............... 307/292, 296.2, 350, 307/354, 360, 362, 363

[56] References Cited

U.S. PATENT DOCUMENTS 4,004,158  1/1977  Morgan .............................. 307/362
4,733,107  3/1988  O'Shaughnessy et al. ..... 307/354 X Primary Examiner—Steven Mottola
Attorney, Agent, or Firm—Joscelyn G. Cockburn

[57] ABSTRACT

Described is a CMOS circuit arrangement with precise balanced, differential switch points. The circuit arrangement includes a voltage-follower which forces a reference voltage across an on-chip reference resistor. The current which is generated is mirrored and is made to flow through a plurality of on-chip resistors. The mirrored current flowing through the plurality of resistors generate a plurality of proportional reference voltages. Two of the proportional reference voltages are used to set the switching threshold to one input of a comparator whose output is fed back to control a switch which selects one of the two voltages. Another one of the proportional reference voltages is coupled to another input of the comparator. The circuit arrangement forms a hysteresis circuit if positive and negative thresholds are chosen.

12 Claims, 2 Drawing Sheets

PRECISION HYSTERESIS CIRCUIT

FIELD OF THE INVENTION

The present invention relates to hysteresis circuits in general and in particular, to those circuits which can be easily implemented with CMOS technology and used in receivers.

PRIOR ART

The prior art abounds with different types of hysteresis circuit arrangements. These circuit arrangments are used in different types of electronic equipment. Hysteresis circuits are used in receivers where the transmitted signal travels over relatively long distance and is susceptible to noise which could cause error in the received signal.

A conventional hysteresis circuit consists of a reference voltage generating section which generates reference voltages and a hysteresis generating section which controls the switch point of the circuit. The hysteresis causes the output of the circuit to remain in an up or down state until an input signal reaches a level set by the reference voltages. Thus, noise in the receiving channel does not necessarily cause the output to switch. Examples of prior art hysteresis circuits are: U.S. Pat. Nos. 4,677,315, 4,535,294, 4,616,145, 4,110,641, 4,233,563, 4,394,587, 4,874,969, 4,556,805, 3,816,760, IBM TDB 4-83 (pgs. 5782-83) and IBM TDB 3-84 (pgs. 5117-18).

The main problem with the prior art circuits is that they lack precision and are not reliable for use in noisy environments where the received signal is in the millivolt range. It is believed that these circuits lack precision because most of them use positive feedback from a comparator output to set the switching threshold. This method is unacceptable because it is very sensitive to variations in the power supply, and is not a balanced, differential hysteresis signal. Another method involves an intentional mismatch in the input differential devices of the comparator. This introduces a voltage offset in the transfer curve of the input devices. The offset, which is in effect hysteresis, is very sensitive to process variation.

SUMMARY OF THE PRESENT INVENTION

It is, therefore, the main object of the present invention to provide a very accurate hysteresis circuit which is sensitive to signals in the millivolt range and which is a balanced, differential signal.

It is another object of the present invention to generate hysteresis reference voltages which are independent of the incoming signal.

It is still another object of the present invention to provide a CMOS hysteresis circuit which is free from process and/or supply voltage variations.

The above and other objects are achieved by generating a known voltage drop across a resistor (R1). This causes a known current to flow through the resistor. The current is mirrored through two banks of stacked resistors having characteristics and values proportional to R1. A precise voltage is generated across each resistor in the bank. Each resistor bank is coupled by separate conductors to one of two input pads (INP, INN). A selected point on each resistor chain or bank is connected to a switch which is connected to one input of a voltage comparator whose output is coupled via feedback to control the switch. The other input to the comparator is connected by a conductor to a selected point on one of the resistor chains.

The contacts have been placed on the resistor banks such that there is either a plus differential voltage or a negative differential voltage applied to the comparator, depending on the state of the switch (assuming no differential voltage applied from INP to INN). The switch control is such that positive value of the comparator output will cause the switch to choose the positive differential voltage. For the comparator to switch states, a negative voltage greater than the positive threshold (the positive differential voltage due to the resistor contact placement) must be applied to INP and INN. The reverse is true if the comparator output is in the negative state. In this case, the switch state is such that a negative differential voltage is applied to the comparator inputs (no differential voltage applied to INP and INN). A positive voltage greater than the negative switch threshold is required from INP to INN to change the state of the comparator.

These and other objects and advantages of this invention will be more fully described in the accompanying drawings.

DETAILED DESCRIPTION OF THE PREFERRED EMBODIMENT

Figure 1:
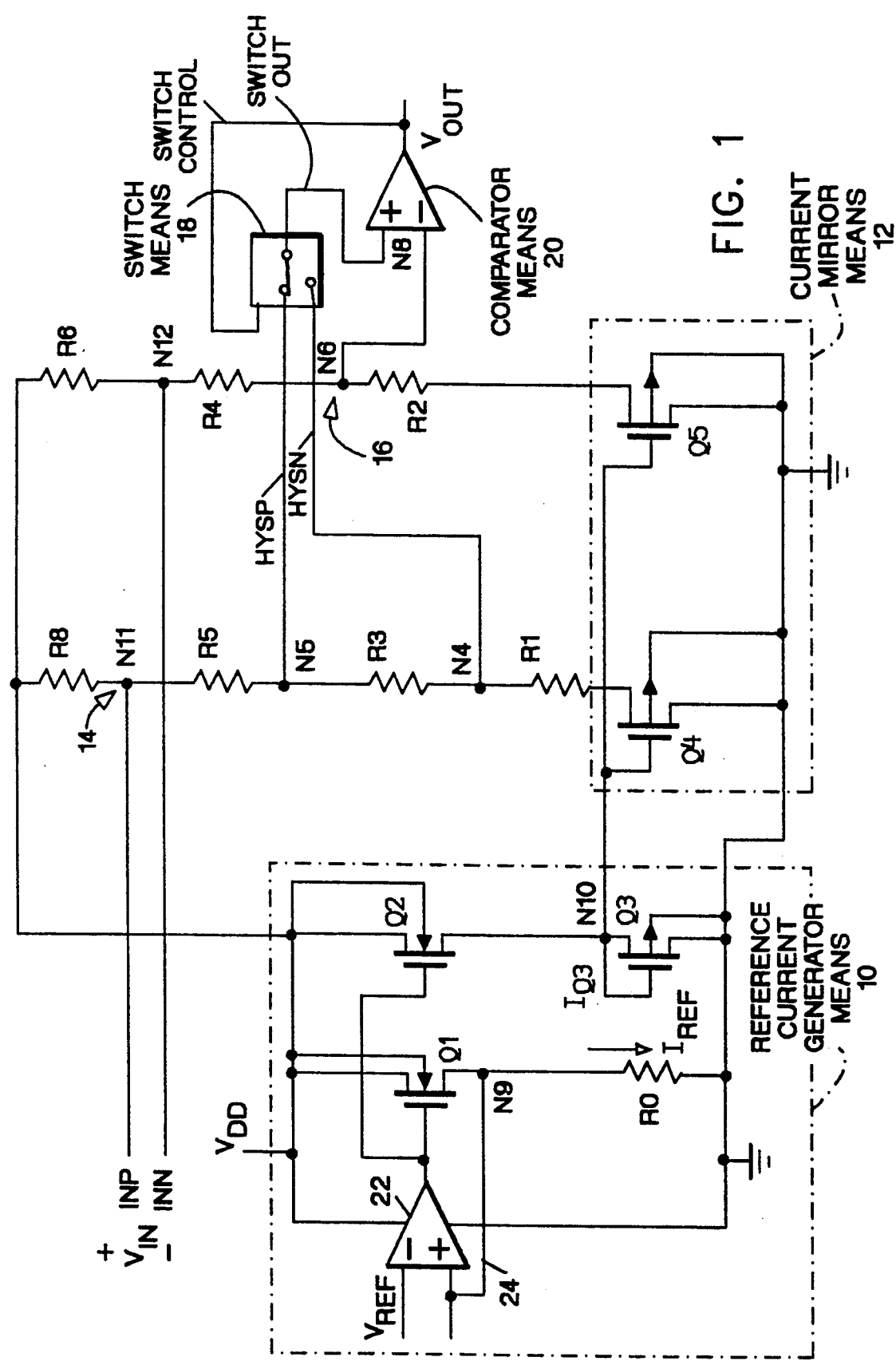
FIG. 1 shows a hysteresis circuit arrangement according to the teachings of the present invention.

FIG. 1 shows a circuit diagram for the hysteresis circuit according to the teachings of the present invention. The circuit includes reference current generator means 10, current mirror means 12, two parallel banks 14 and 16 of resistor switch means 18 and comparator means 20. The reference current generator means 10 includes a voltage follower which forces a reference voltage across an on-chip reference resistor R0. The force reference voltage is unaffected by process changes in the resistor and is equal to the resistor value times the current $I_{REF}$ through the resistor. By mirroring the generated current ($I_{REF}$) and using resistive banks 14 and 16 with resistors proportional to R0 and made from the same material as R0 a number of precise voltages are produced. The voltages are used to set the switching thresholds of any number of comparators, only one of which is shown in FIG. 1. Preferably, switch means 18 is an analog switch. The input to the analog switch 18 is coupled to nodes N4 and N5 on resistive bank 14. The output of comparator means 20 is tied to the control terminal of switch 18 (not shown) and controls which switching threshold is being used. By choosing a positive and negative threshold (when appropriate), the circuit in FIG. 1 becomes a balanced, differential hysteresis circuit that is responsive to relatively small input signals on terminal INP and INN. A more detailed description of the circuit will be given below.

Still referring to FIG. 1, the reference current generator means 10 is comprised of a two-stage voltage follower consisting of an op amp 22 (first stage) followed by a transistor/load resistor (Q1/R0) (second stage). A conductor 24 interconnects the transistor/load resistor node N9 to the positive input terminal of op amp 22. A fixed voltage $V_{REF}$ is applied to the negative terminal of op amp 22. The power supply terminals of op amp 22 are tied to power supply voltages $V_{DD}$ and ground. The op amp 22, P-channel FET device Q1 and resistor R0 forms a negative feedback loop. This negative feedback loop forces the voltage across R0 to the voltage on $V_{REF}$. As the value of R0 varies, the magnitude of the current $I_{REF}$ also varies to compensate for this change. The FET device Q2 has its gate electrode connected to the output of op amp 22. Its substrate and source electrodes are connected to $V_{DD}$ and its drain electrode is connected to node N10. FET device Q2 is a P-channel FET identical to device Q1 and carry the same current $I_{REF}$. An N channel FET device Q3 is configured as a diode and interconnects node N10 to ground potential.

The gates of N channel FET devices Q4 and Q5 are connected in parallel between node N10 and ground potential. Devices Q4 and Q5 form current mirror means 12. As can be seen in the figure, the diode connected device Q3 biases Q4 and Q5 such that their current is a multiple of $I_{REF}$. Stated another way, the current through Q4 and Q5 is a multiple of current through Q2. Resistive bank 14 includes a plurality of resistors R1, R3, R5 and R8 interconnecting FET device Q4 to $V_{DD}$. Similarly, resistive bank 16 is parallel to resistive bank 14 and includes a plurality of resistors R2, R4 and R6 which interconnect device Q5 to $V_{DD}$. Resistive bank 14 is connected at node N11 to an input terminal INP. Similarly, resistive bank 16 is connected at node N12 to input node INN. Node INN and node INP are designated to receive an input signal $V_{IN}$.

Still referring to FIG. 1, in the preferred embodiment of this invention, switch means 18 is an analog switch with input nodes connected to node N4 and N5 and its output node connected to the positive input terminal of comparator means 20. The output of comparator means 20 is fed back to control which of the two input nodes of the switch is selected. A more detailed description of the analog switch is given below.

The negative terminal of comparator means 20 is connected to node N6. Even though the description and FIG. 1 indicate that the switch is connected to node N4 and N5 depending on the voltage that is required across the switch, different nodes on the respective resistive banks can be selected to connect the switch. Also, the device forming the resistive bank need not be resistors but can be other devices which can be used to provide voltages as input to the analog switch. It should be noted that the resistive banks 14 and 16 are fabricated from the same material as R0 and care is taken in laying out these devices so that the resistors track to less than 1% variation. Therefore, the voltage drop across resistive bank 14 and 16 will be a multiple of the voltage across R0 (the same multiple as the current mirror ratio). By placing contacts at desired points of the resistive banks 14 and 16 respectively, a desired differential voltage can be obtained.

Figure 2:
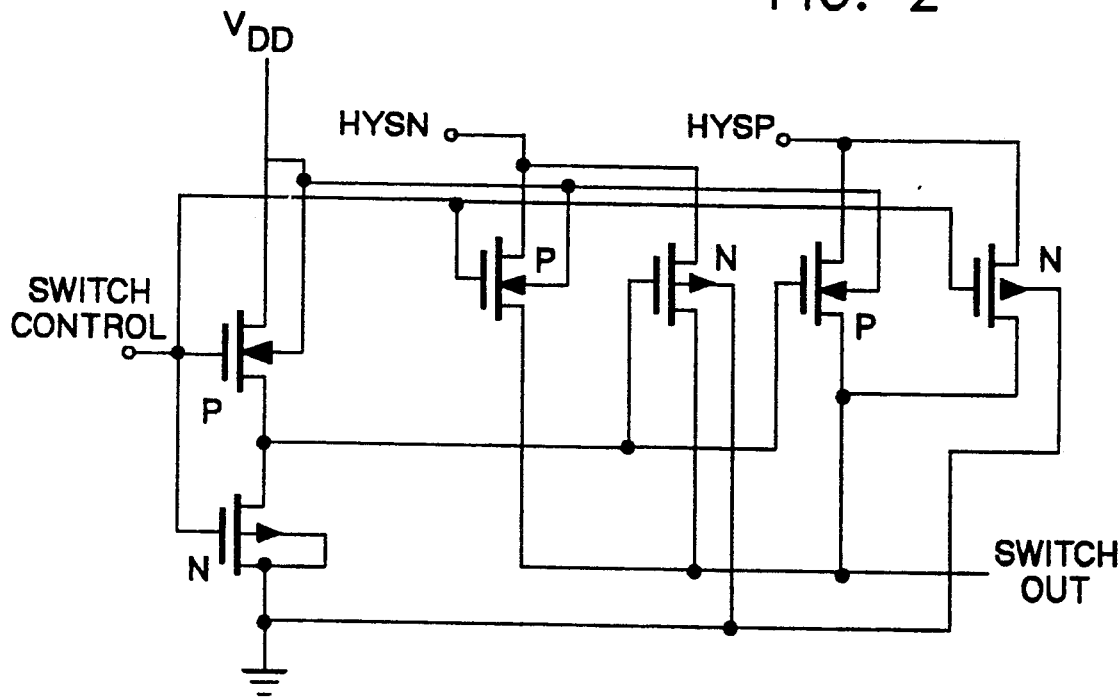
FIG. 2 shows a circuit arrangement for an analog switch that is used in the circuit arrangement of FIG. 1.

FIG. 2 shows a circuit diagram for an analog switch which can be used in FIG. 1. Preferably, the switch is fabricated with CMOS technology. The switch includes pairs of PFET and NFET devices connected as shown in the drawings. The switch has nodes labeled switch control, $V_{DD}$, GND, SWITCH OUT, HYSP and HYSN. The nodes are connected to appropriate contact points in the circuit of FIG. 1. The position of the switch is controlled by a feedback signal driving the node labeled SWITCH CONTROL. Power to the switch is provided through the nodes labeled $V_{DD}$ and ground (GND) respectively. With reference to FIG. 1 for the moment, the node labeled SWITCH OUT is connected with a conductor to the positive input terminal of comparator means 20. Similarly, nodes HYSP and HYSN are connected by respective conductors to nodes N5 and N4. Finally, node labeled SWITCH CONTROL is connected through a feedback loop to the output (Vout) of comparator means 20.

The state of the switch is controlled by the output of comparator means 20. The contacts have been placed at nodes N4 and N5 such that there is either a plus differential voltage or a negative differential voltage applied to the comparator, depending on the state of the switch (assuming no differential voltage is applied to INP and INN). The switch control is such that positive value of the comparator output will cause the switch to choose a positive differential voltage. For the comparator to switch states, a negative voltage greater than the positive threshold (the positive differential voltage due to the resistor contact placement) must be applied from INP to INN. The reverse is true if the comparator output is in the negative state. In this case, the switch state is such that the negative differential voltage is applied to the comparator inputs (no differential voltage applied to INP and INN). A positive voltage greater than the negative switch threshold is required from INP to INN to change the state of the comparator. Having described the circuit and how it is interconnected, its operation will now be described.

OPERATION

With reference to FIG. 1, the circuit shows a negative feedback loop consisting of the op amp, resistor R0, and the P-channel FET transistor Q1. The feedback loop forces the voltage across R0 to be equal to the voltage on the node labeled $V_{REF}$. A current is produced in R0 which is expressed mathematically as $$I_{REF} = V_{REF}/R0$$

where $I_{REF}$ is a current flowing through R0, R0 is the value of an on-chip resistor and $V_{REF}$ is a precise voltage. $I_{REF}$ is provided by transistor Q1. Q1 and Q2 form a current mirror with Q3 being the load for Q2. $I_{REF}$ is mirrored into Q3 with the current (IQ3) in Q3 being expressed as $$IQ3 = [(W2/L2)/(W1/L1)] \times I_{REF}$$

where W and L are respective length and width ratios of devices Q1 and Q2. It should be noted that the current IREF is a DC current. Also, IQ3 is mirrored using NFET transistors Q4 and Q5 in conjunction with Q3. With this configuration of Q3, Q4 and Q5, any multiple (or sub-multiple) of IREF can be obtained. It should be noted that the use of resistors in the resistive bank 14 and 16 is only one way of generating multiple current voltages based on $I_{REF}$. However, it is well within the skill of the art to utilize other circuit components for generating precise multiple voltages.

Even though the circuit of FIG. 1 can be used in many different ways, one of its uses will now be described. The circuit was used in the receiver of an electronic device. The circuit performed three functions. It is used as a DC bias for the receiver input pins (the receiver is transformer coupled to the transmission line). Secondly, it provides the proper impedance to transformer/filter network. Thirdly, and most importantly, it provides a signal regenerator with the required precise, small magnitude hysteresis (approximately 30 mV switching thresholds in this case). To carry out these duties, table 1 below shows value for the respective resistors shown in FIG. 1. Again, it should be understood that these values are for a specific design to obtain plus or minus 30 millivolt across the input to the comparator means 20 (FIG. 1). It is well within the skill of the art to use other values to obtain other voltage across the comparator. As is shown in table 1, R0 has a value of 9 Kohms resistance. The series combination of R1, R3, R5 and R8 forms a 9.0 Kohm resistor as does the combination of R2, R4 and R6. Since the currents through Q4 (IQ4) and Q5 (IQ5) are a multiple of IRF, voltage drop across each of the resistor branches will be a multiple of the voltage $V_{REF}$.

TABLE I

| Resistors | Value in Kohms |
|---|---|
| R0 | 9.0 |
| R1 | 0.6 |
| R2 | 1.2 |
| R3 | 1.2 |
| R4 | 1.8 |
| R5 | 1.2 |
| R6 | 6.0 |
| R8 | 6.0 |

If Q4 and Q5 are the same size, the current through them would be equal. By selecting the proper ratio of resistance values in the two resistor branches of FIG. 1, an arbitrary difference in potential between points in the two branches are formed. For example, assume IQ4 and IQ5 are equal to 50 micro-amps. For the resistor values shown in table 1, node 5 will be at a 30 millivolt higher potential than node 6 due to the 600 ohm difference between R3 and R4, if nodes INN and INP are held at the same potential. Likewise, node N4 will be at the 30 millivolt lower potential than N6 due to the 600 olm greater resistance of the series combination of R3 and R5 as compared to R4.

Referring again to FIG. 1, node N6 is connected to the negative input of the comparator. The analog switch, details shown in FIG. 2, is used to apply either the voltage at node N4 or the voltage at node N5 to the positive input to the comparator. As mentioned above, the state of the switch is controlled by a signal which is provided by the output of comparator means 20. With the switch in the position shown in FIG. 1, there is a +30 millivolt difference applied across the comparator inputs. To switch the output of the comparator and change the state of the switch, the voltage at node INN would have to go 30 millivolts greater than the voltage at node INP. The 30 millivolts is a negative switching threshold.

Figure 3:
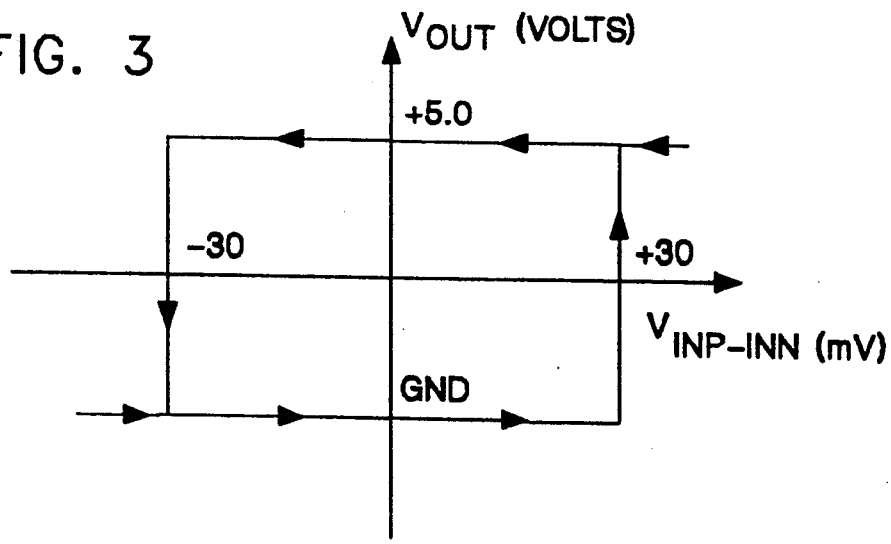
FIG. 3 shows a hysteresis graph for the circuitry of FIG. 1.

Turning to FIG. 3 for the moment, a plot of a voltage transfer characteristic for the differential hysteresis circuit (FIG. 1) is shown. The 30 millivolt switch point is labeled in FIG. 3 as −30 on the VINP-INN scale. A similar analysis can be made to obtain the positive switching threshold if the switch is first assumed to be in the state opposite to the one shown in FIG. 1. Thus, the hysteresis curve of FIG. 3 shows that the output from the circuit will remain at ground or +5 volts until a + or −30 millivolts change occur within the input signal. Based upon the above, FIG. 3 is a balanced, differential hysteresis circuit with a switching threshold of ±30 millivolts. The comparator output (FIG. 1) is used to control only the state of the switch. The hysteresis levels are set by the reference current generator 10 (FIG. 1), the current mirrors and the resistive branches 14 and 16 respectively. The resistive banks 14 and 16 are used for biasing and input impedance control. The node $V_{DD}$ can be connected to any desired power supply that will yield the proper circuit biasing. In the preferred embodiment of this invention, the node was connected to a power source of +5 volts. Due to the symmetry and differential nature of this circuit, a high common rejection ratio is achieved. The feedback loop of the hysteresis generator and careful physical layout cancel out most of the process variations.

The circuit is applicable to any technology having an analog switch.

The hysteresis is fully differential and balanced with a large common mode noise rejection.

Hysteresis switching levels are independent of the comparator output in contrast to the traditional positive feedback implementation. The levels are based on a DC feedback circuit which is buffered from both the input signal and the comparator output. The feedback circuit shown is one of several that can be used to generate the desired reference current.

The large output voltage swing of the comparator is buffered from the overall circuit by the high gate impedance of the gating transistors of the analog switch. The comparator is not used in the traditional positive feedback mode (that is, a Schmidt trigger).

Both relative and absolute accuracy of hysteresis levels in the tens of millivolts can be obtained.

While the invention has been particularly shown and described with reference to the preferred embodiment thereof, it will be understood that various changes in form and details may be made therein without departing from the spirit and scope of the invention.

I claim:

1. A circuit arrangement for providing a precision balanced, differential hysteresis comprising in combination:
   a reference current generator means for generating a reference current ($I_{REF}$)
   a first means for generating a first set of voltages;
   a second means for generating a second set of voltages;
   a third means interconnecting the first and second means to the reference current generator; said third means mirroring the reference current ($I_{REF}$) through said first and second means;
   a switch means having a first node coupled to a selected tap on said first means, a second node coupled to a selected tap on said first means, an output node and a switch control node; and
   a comparator means having an output node coupled to the control node; a first input node coupled to the output node of the switch means and a second input node coupled to a selected tap on said second means.

2. The circuit arrangement of claim 1 further including a first and second terminals coupled to selected taps on the first and second means; said terminals operable for receiving an input signal.

3. The circuit arrangement of claim 1 wherein the reference current generator means includes:
   an operational amplifier having an output node, a pair of input nodes and control nodes;
   a pair of FET devices arranged in a parallel configuration and coupled to the output node;

a first FET device coupling one of the pair of FET devices to one of the control nodes;

a resistive means coupling another of the pair of FET devices to said one of the control nodes;

a reference voltage connected to one of the pairs of input nodes; and a conductive means interconnecting another one of the pairs of input nodes to one of the pairs of FET devices.

4. The circuit arrangement of claim 1 wherein the first means includes a plurality of series connected resistors.

5. The circuit arrangement of claim 1 wherein the second means includes a plurality of series connected resistors.

6. A circuit arrangement for generating a reference current used by a hysteresis circuit comprising:

an operational amplifier having an output node for delivering the reference current to the hysteresis circuit, a pair of input nodes and control nodes;

a pair of FET devices arranged in a parallel configuration and coupled to the output node;

a first FET device coupling one of the pair of FET devices to one of the control nodes;

a resistive means coupling another of the pair of FET devices to said one of the control nodes;

a reference voltage connected to one of the pairs of input nodes; and a conductive means interconnecting another one of the pairs of input nodes to one of the pairs of FET devices.

7. A circuit arrangement for generating precise voltages on a chip comprising:

a first means for generating a reference current ($I_{REF}$) disposed on said chip;

a second means including a plurality of independent resistive means disposed on said substrate;

a third means including a plurality of independent resistive means connected in parallel to the second means; and a fourth means interconnecting the first means with the second and third means; said fourth means mirroring the reference current ($I_{REF}$) to flow through respective independent resistive means to form precise voltages there across.

8. The circuit arrangement of claim 7 wherein the resistive means includes a plurality of resistors.

9. The circuit arrangement of claim 7 wherein the first means includes a reference resistor (R0) and the plurality of resistors are proportional to the on-chip resistive means (R0).

10. A method for setting the hysteresis on a chip comprising:

(a) generating a precise voltage across an on-chip resistive means (R0);

(b) mirroring a current ($I_{REF}$) flowing in the on-chip resistive means (R0) to flow in a plurality of ratioed independent resistive means; and (c) comparing a voltage which is generated across a selected one of the ratioed independent resistive means with switched voltages generated across selected ones of said ratioed independent resistive means.

11. An apparatus for generating hysteresis on an integrated circuit chip comprising:

means for generating a precise voltage across an on-chip resistive means (R0);

means for mirroring a current ($I_{REF}$) flowing in the on-chip resistive means (R0) to flow in a plurality of ratioed independent resistive means; and means for comparing a fixed voltage which is generated across a selected one of the ratioed independent resistive means with a selected one of a plurality of switched voltages generated across selected ones of said ratioed independent resistive means.

12. The apparatus of claim 11 wherein the plurality of independent resistive means are proportional to the on-chip resistive means (R0).

* * * * *